(12) United States Patent
Ogawa

(10) Patent No.: US 7,566,976 B2
(45) Date of Patent: Jul. 28, 2009

(54) SEMICONDUCTOR DEVICE AND METHOD FOR FABRICATING THE SAME

(75) Inventor: Shinichi Ogawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/007,071

(22) Filed: Jan. 7, 2008

(65) Prior Publication Data
US 2008/0122112 A1    May 29, 2008

Related U.S. Application Data

(63) Continuation of application No. 11/492,007, filed on Jul. 25, 2006, now Pat. No. 7,339,270.

(30) Foreign Application Priority Data

Aug. 5, 2005    (JP)    .............................. 2005-228769

(51) Int. Cl.
  *H01L 23/48* (2006.01)
(52) U.S. Cl. ........................ 257/774; 257/750; 257/751; 257/763; 257/764; 257/773; 257/776; 257/E21.273
(58) Field of Classification Search ................. 257/750, 257/751, 753, 762, 767, E23.16, E21.273, 257/E23.112, 773–776
See application file for complete search history.

(56) References Cited

U.S. PATENT DOCUMENTS

| 6,372,670 | B1 | 4/2002 | Maeda | |
| 6,396,122 | B1 * | 5/2002 | Howard et al. | ............... 257/531 |
| 6,528,409 | B1 | 3/2003 | Lopatin et al. | |
| 6,602,802 | B2 | 8/2003 | Aoi | |
| 6,873,052 | B2 | 3/2005 | Aoi | |
| 6,964,919 | B2 | 11/2005 | Kloster et al. | |
| 6,982,224 | B2 * | 1/2006 | Cho | ........................... 438/637 |
| 7,015,150 | B2 | 3/2006 | Cooney et al. | |
| 7,157,373 | B2 | 1/2007 | Knorr et al. | |
| 7,199,044 | B2 | 4/2007 | Ohtsuka et al. | |
| 2004/0259381 | A1 | 12/2004 | Ohtsuka et al. | |
| 2006/0115982 | A1 | 6/2006 | Morisue et al. | |

OTHER PUBLICATIONS

M. Assous, et al., "Porous Dielectric Dual Damascene Patterning Issues for 65nm Node: Can Architecture Bring a Solution?", IEEE, ITC 2003, pp. 97-99.

Tomoji Nakamura, et al., "Robust Multilevel Interconnects with a Nano-clustering Porous Low-k (k<2.3)", IEEE, IITC 2004, pp. 175-177.

Akira Furuya, et al, "Pore-sealing by Etch-Byproduct Followed by ALD-Ta Adhesion Layer for Cu/Porous Low-k Interconnects", IEEE, IITC 2004, pp. 39-41.

* cited by examiner

*Primary Examiner*—Jasmine J Clark
(74) *Attorney, Agent, or Firm*—McDermott Will & Emery LLP

(57) ABSTRACT

A semiconductor device has a porous low-dielectric-constant film formed on a substrate and having an opening and a fine particle film composed of a plurality of aggregately deposited fine particles each having a diameter of not less than 1 nm and not more than 2 nm and formed on a surface of the portion of the porous low-dielectric-constant film which is formed with the opening. The fine particles are filled in voids exposed at the surface of the portion of the porous low-dielectric-constant film which is formed with the opening.

7 Claims, 6 Drawing Sheets

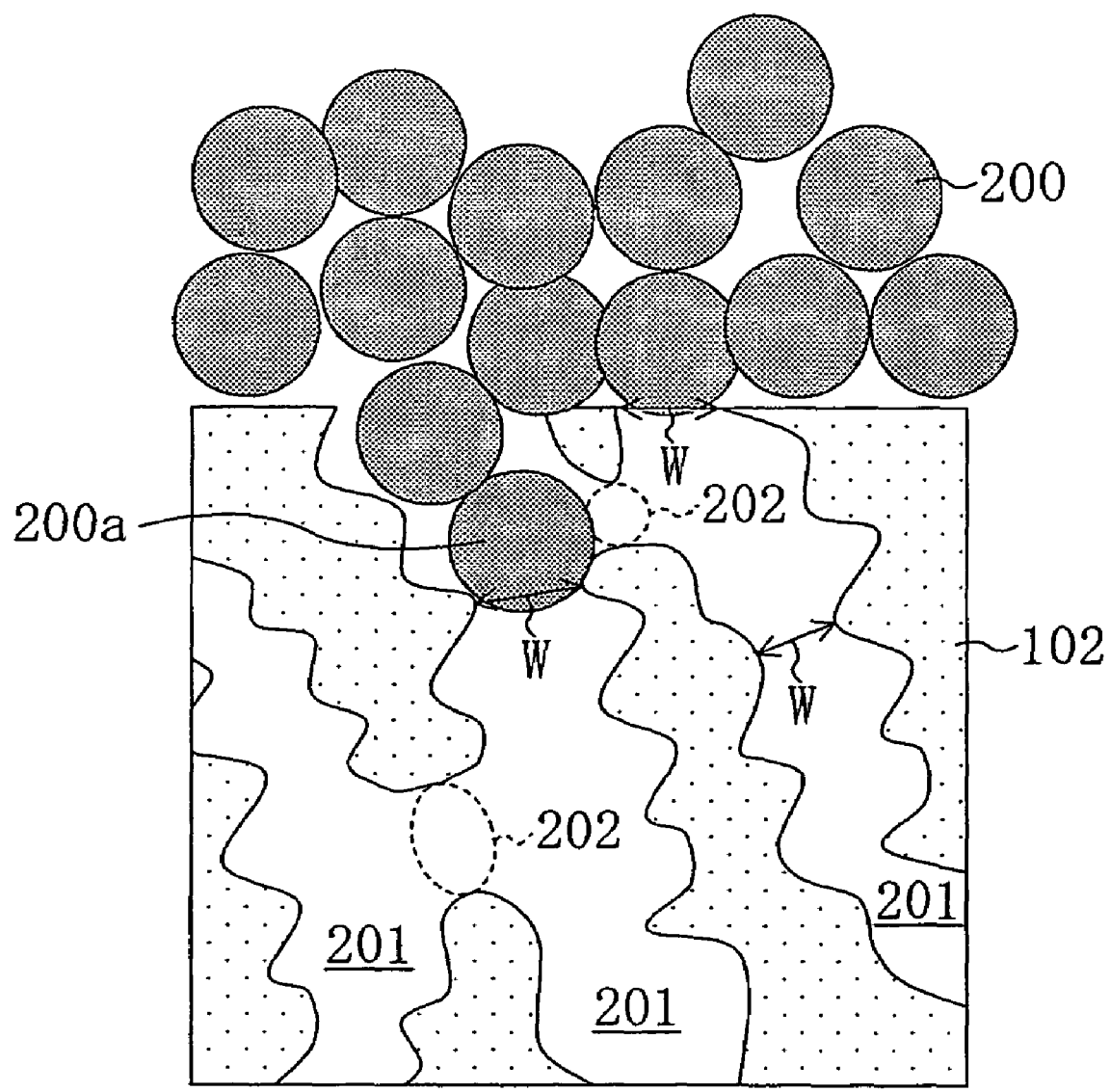

SEMICONDUCTOR DEVICE AND METHOD FOR FABRICATING THE SAME

RELATED APPLICATIONS

This application is a Continuation of U.S. application Ser. No. 11/492,007, filed Jul. 25, 2006, now U.S. Pat. No. 7,339,270 claiming priority of Japanese Patent Application JP 2005-228769, filed Aug. 5, 2005, the entire contents of each of which are entirely incorporated herein by reference.

BACKGROUND OF THE INVENTION

The present invention relates to a semiconductor device and a method for fabricating the same and, more particularly, to a highly-integrated and miniaturized LSI device and a method for fabricating the same.

There have been growing expectations on Cu interconnects having low electric resistance and high resistance to electromigration (EM) as a material for interconnects in a highly-integrated and miniaturized LSI device.

However, the microfabrication of Cu interconnects is extremely difficult. As one of effective methods for implementing microfabricated Cu interconnects, a damascene method which buries a Cu film in an underlying film to which via-hole/interconnect-trench forming processes have been performed can be listed. As means for burying the Cu film, an electrolytic plating method can be listed.

A description will be given herein below to a method for fabricating a semiconductor device comprising Cu interconnects formed by using a damascene method with reference to FIGS. 4A to 4C and FIGS. 5A and 5B (see, e.g., Non-Patent Document 1: IEEE, IITC 2003, pp. 97-99, FIG. 7). FIGS. 4A to 4C and FIGS. 5A and 5B are cross-sectional views illustrating the principal process steps of the method for fabricating the semiconductor device according to a conventional embodiment.

First, as shown in FIG. 4A, lower interconnects 301 composed of a Cu film 301b are formed in an interlayer insulating film 300 formed on a substrate (not shown) each with a barrier metal 301a interposed therebetween. Then, a low-dielectric-constant film 302 is formed on the interlayer insulating film 300. Subsequently, dry etching is selectively performed with respect to the low-dielectric-constant film 302, thereby forming via holes 303 for exposing the upper surfaces of the lower interconnects 301 in the low-dielectric-constant film 302 and forming interconnect trenches 304 connecting to the respective via holes 303 also in the low-dielectric-constant film 302. Next, as shown in FIG. 4B, a barrier metal 305 made of, e.g., TaN, TiN, or WN is formed over the sidewalls and bottom portions of the via holes 303, the sidewalls and bottom portions of the interconnect trenches 304, and the upper surface of the low-dielectric-constant film 302. Then, as shown in FIG. 4C, a seed layer 306 for electrolytic plating made of Cu is formed on the barrier metal film 305.

Next, as shown in FIG. 5A, Cu is buried in each of the via holes 303 and the interconnect trenches 304 by using an electrolytic plating method so that a plate layer 307 made of Cu is formed. At this time, since Cu composing the seed layer 306 is diffused into the plate layer 307, the boundary line between the seed layer 306 and the plate layer 307 cannot be substantially recognized so that it is not shown. Then, as shown in FIG. 5B, the respective portions of the barrier metal 305 and the plate layer 307 which are located outside the interconnect trenches 304 are removed by CMP till the surface of the low-dielectric-constant film 302 is exposed, whereby surface planarization is performed.

In this manner, an interconnect plug composed of buried Cu is formed in each of the via holes 303 with the barrier metal 305 interposed therebetween, while an upper interconnect 308 composed of buried Cu is formed in each of the interconnect trenches 304 also with the barrier metal 305 interposed therebetween.

In the recent device development, the use of a low-dielectric-constant film having voids therein has been examined with the view to further reducing the low dielectric constant of a low-dielectric-constant film.

A description will be given herein below to a method for forming a low-dielectric-constant film having voids therein.

A solution containing organic particles having sizes substantially equal to the objective sizes (diameters of, e.g., about 1 nm) of the voids is applied onto an interlayer insulating film having lower interconnects. Subsequently, by removing the organic particles contained in the applied solution at a low temperature (specifically, at a temperature of 100° C. to 200° C.), a coating layer for forming the low-dielectric-constant film can be formed. Thus, the coating layer having the voids formed through the removal of the organic particles has been formed by selecting organic particles having desired sizes as the organic particles contained in the applied solution. Since the sizes of the voids derive from the sizes of the organic particles, each of the organic particles is termed a porogen or template.

By applying a solution containing, e.g., a material (e.g., NCS or the like) having internal voids of minute sizes (diameters of, e.g., about 1 nm) on an interlayer insulating film having lower interconnects, a coating layer for a low-dielectric-constant film having voids of desired sizes can be formed (see, e.g., Non-Patent Document 2: IEEE, IITC 2004, pp. 175-177, FIG. 1). Thus, the coating layer having the voids has been formed by selecting a material having internal voids of desired sizes as the material contained in the applied solution.

In each of the cases described above, the low-dielectric-constant film having the internal voids of desired sizes (diameters of, e.g., about 1 nm to about 2 nm) can be formed by forming the coating layer having the internal voids of desired sizes and then annealing the coating layer by a thermal process at a temperature of 400° C.

However, the method for fabricating the semiconductor device according to the conventional embodiment has had the following problems. A description will be given to the problems encountered by the method for fabricating the semiconductor device according to the conventional embodiment with reference to FIGS. 6A and 6B. FIGS. 6A and 6B are cross-sectional views illustrating the principal process steps of the method for fabricating the semiconductor device according to the conventional embodiment.

When the low-dielectric-constant film (hereinafter referred to as a porous low-dielectric-constant film) 302 having voids therein is used in the method for fabricating the semiconductor device according to the conventional embodiment, the voids (not shown) having diameters of about 1 nm to about 2 nm are exposed at the regions of the porous low-dielectric-constant film 302 to which dry etching has been performed in the step of forming the via holes 303 and the interconnect trenches 304 (see FIG. 4A mentioned above), i.e., at the sidewalls of the via holes 303 and at the bottom portions and sidewalls of the interconnect trenches 304.

Consequently, the barrier metal 305 is formed directly over the sidewalls of the via holes 303 and the bottom portions and sidewalls of the interconnect trenches 304 having respective surfaces at which the voids are exposed in the step of forming the barrier metal 305 (see FIG. 4B mentioned above). As a result, a material (such as, e.g., TaN, TiN, or WN) composing the barrier metal 305 is diffused into the porous low-dielectric-constant film 302 via the voids so that diffusion regions 400 are formed to cause the problem of the degraded barrier property of the barrier metal 305, as shown in FIG. 6A.

Accordingly, the barrier metal 305 cannot sufficiently perform the function as the barrier film so that the material Cu composing the plate layer 307 passes through the barrier metal 305 and is further diffused into the porous low-dielectric-constant film 302 via the voids to form Cu diffusion regions 401, as shown in FIG. 6B. During the operation of the semiconductor device also, the material Cu composing the plate layer 307 is further diffused into the porous low-dielectric-constant film 302.

Thus, in the method for fabricating the semiconductor device according to the conventional embodiment, the barrier property of the barrier metal 305 deteriorates so that the material Cu composing the plate layer 307 is diffused into the porous low-dielectric-constant film 302 during the fabrication and operation of the semiconductor device. As a result, the Cu diffusion regions 401 are formed so that a leakage current flows between the individual upper interconnects 308 through the path R, as shown in FIG. 6B. This causes the problem of the faulty operation of the semiconductor device and also causes the problem of a significant reduction in the production yield of the semiconductor device.

As a technology for solving these problems, a method has been proposed which causes a plasma by-product generated during dry etching to be deposited on the surface of the porous low-dielectric-constant film in the step of forming the via holes and the interconnect trenches and thereby clogs the voids exposed at the surfaces of the porous low-dielectric-constant film (see, e.g., Non-Patent Document 3: IEEE, IITC 2004, pp. 39-41).

In accordance with the method mentioned above, however, it is difficult to cause a plasma by-product to be deposited with high reproducibility on the surfaces (especially on the portions of the porous low-dielectric-constant film at which the voids are exposed) of the porous low-dielectric-constant film. Accordingly, it has been difficult to reliably clog the voids exposed at the surfaces of the porous low-dielectric-constant film.

SUMMARY OF THE INVENTION

In view of the foregoing, it is therefore an object of the present invention to provide a semiconductor device and a method for fabricating the same which allow a barrier metal to retain a sufficient barrier property by reliably clogging voids exposed at the surfaces of a porous low-dielectric-constant film during the formation of via holes and interconnect trenches and also allow interconnects each having high reliability and a miniaturized structure to be implemented.

To attain the object, a semiconductor device according to an aspect of the present invention comprises: a porous low-dielectric-constant film formed on a substrate and having an opening; and a fine particle film composed of a plurality of aggregately deposited fine particles each having a diameter of not less than 1 nm and not more than 2 nm and formed on a surface of the portion of the porous low-dielectric-constant film which is formed with the opening, wherein the fine particles are filled in voids exposed at the surface of the portion of the porous low-dielectric-constant film which is formed with the opening.

In the semiconductor device according to the aspect of the present invention, the voids exposed at the surface of the portion of the porous low-dielectric-constant film which is formed with the opening can be filled with the fine particles by selecting fine particles each having a size (a diameter of, e.g., 1 nm to 2 nm) equal to that of each of the voids exposed at the surface of the portion thereof. As a result, it becomes possible to prevent a material (e.g., a conductive material) buried in the opening from being diffused into the porous low-dielectric-constant film via the voids.

In the semiconductor device according to the aspect of the present invention, a conductive material forming a via or an interconnect is preferably buried in the opening such that the fine particle film is interposed between the conductive material and the porous low-dielectric-constant film.

In the arrangement, the voids exposed at the surface of the portion of the porous low-dielectric-constant film which is formed with the opening are filled with the fine particles composing the fine particle film. Accordingly, it is possible to prevent the conductive material (e.g., a via member or an interconnect member) buried in the opening from being diffused into the porous low-dielectric-constant film via the voids.

As a result, a leakage current does not flow between the individual interconnects each composed of the buried interconnect member in the semiconductor device according to the aspect of the present invention. This allows interconnects each having high reliability and a miniaturized structure to be implemented and also allows improvements in the reliability and production yield of the semiconductor device.

In the semiconductor device according to the aspect of the present invention, a barrier film is preferably interposed between at least the conductive material and the fine particle film.

In the arrangement, the voids exposed at the surface of the portion of the porous low-dielectric-constant film which is formed with the opening are filled with the fine particles composing the fine particle film so that a barrier film is not formed directly on the porous low-dielectric-constant film having surfaces at which the voids are exposed.

This prevents the material composing the barrier film from being diffused into the porous low-dielectric-constant film via the voids. As a result, it is possible to allow the barrier film to retain a sufficient barrier property and reliably prevent the conductive material (e.g., the via member or the interconnect member) buried in the opening from being diffused into the porous low-dielectric-constant film.

Accordingly, a leakage current does not flow between the individual interconnects each composed of the buried interconnect member in the semiconductor device according to the aspect of the present invention. This allows interconnects each having high reliability and a miniaturized structure to be implemented and also allows improvements in the reliability and production yield of the semiconductor device.

In the semiconductor device according to the aspect of the present invention, the conductive material is preferably Cu.

In the semiconductor device according to the aspect of the present invention, each of the fine particles is preferably made of a fullerene or silicon dioxide.

A method for fabricating a semiconductor device according to the aspect of the present invention comprises the steps of: (a) forming a porous low-dielectric-constant film on a substrate; (b) forming an opening in the porous low-dielectric-constant film; and (c) coating a solution containing a plurality of fine particles each having a diameter of not less than 1 nm and not more than 2 nm on a surface of the portion of the porous low-dielectric-constant film which is formed with the opening and removing a solvent of the solution therefrom to form a fine particle film composed of the plurality of aggregately deposited fine particles.

In accordance with the method for fabricating a semiconductor device according to the aspect of the present invention, the surface of the portion of the porous low-dielectric-constant film which is formed with the opening can be coated with the fine particles each having a size (a diameter of, e.g., 1 nm to 2 nm) equal to that of each of the voids exposed at the surface of the portion thereof during the formation of the fine particle film. As a result, it is possible to fill the voids exposed at the surface of the portion of the porous low-dielectric-constant-film with the fine particles composing the fine particle film during the formation of the opening.

Thus, the semiconductor device according to the aspect of the present invention and the method for fabricating the same allow the fine particles composing the fine particle film to fill in the voids exposed at the surface of the portion of the porous low-dielectric-constant film which is formed with the opening. Accordingly, it is possible to allow the barrier film to retain a sufficient barrier property and implement interconnects each having high reliability and a miniaturized structure.

BRIEF DESCRIPTION OF THE DRAWINGS

FIG. 3 is an enlarged view of the near-surface portion of a porous low-dielectric-constant film formed with a fine particle film;

DESCRIPTION OF THE PREFERRED EMBODIMENTS

Figure 1A:
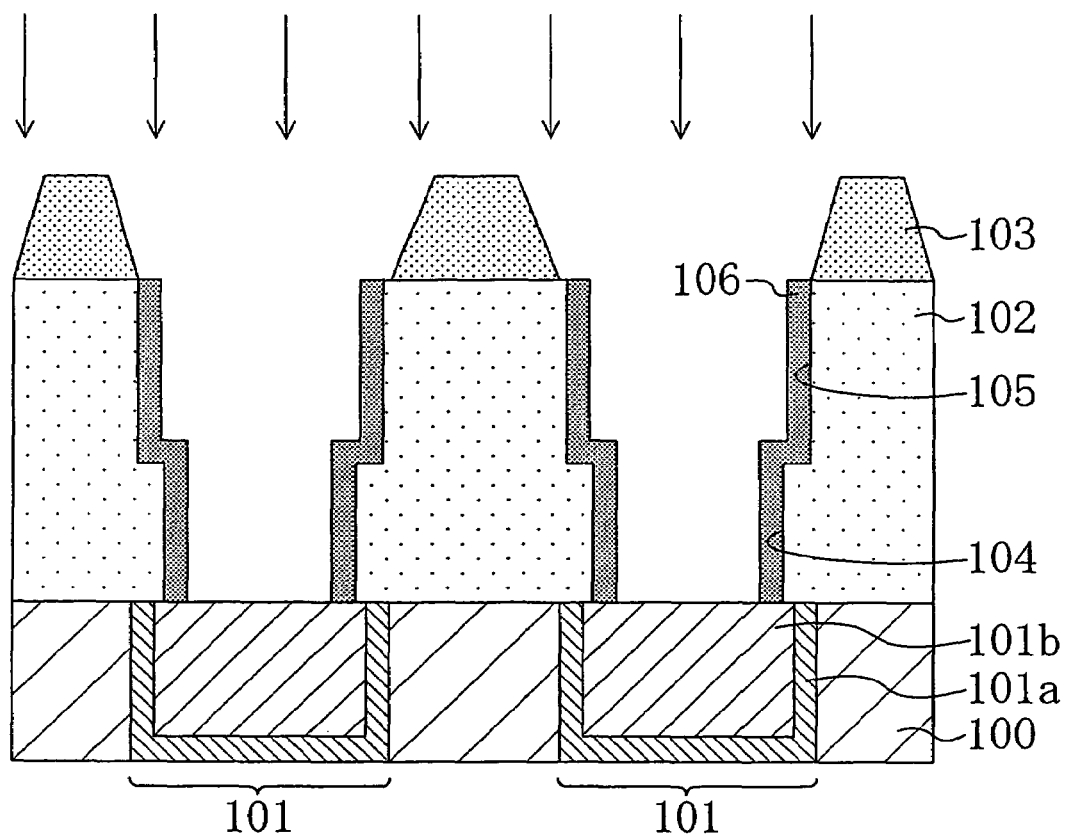
FIGS. 1A and 1B are cross-sectional views illustrating the principal process steps of a method for fabricating a semiconductor device according to an embodiment of the present invention.

Referring to the drawings, a description will be given herein below to an embodiment of the present invention.

A method for fabricating a semiconductor device according to the embodiment will be described with reference to FIGS. 1A, 1B, 2A, and 2B. FIGS. 1A, 1B, 2A, and 2B are cross-sectional views illustrating the principal process steps of the method for fabricating the semiconductor device according to the embodiment.

First, as shown in FIG. 1A, lower interconnects 101 composed of a Cu film 101b are formed in an interlayer insulating film 100 formed on a substrate (not shown) each with a barrier metal 101a interposed therebetween. Then, a porous low-dielectric-constant film 102 is formed on the interlayer insulating film 100. At this time, as a material composing the porous low-dielectric-constant film 102, a methyl-containing-polysiloxane-based (MSQ-based: Methylsilsesquioxane-based) film, e.g., is used.

Thus, in the method for fabricating the semiconductor device according to the present invention, MSQ having a low dielectric constant is used as the material composing the porous low-dielectric-constant film. In addition, porous MSQ having voids therein is used with the view to further reducing the low dielectric constant of MSQ.

Next, a photoresist 103 having a desired pattern is formed on the porous low-dielectric-constant film 102. Then, by using the photoresist 103 as a mask, dry etching is selectively performed with respect to the porous low-dielectric-constant film 102, thereby forming via holes 104 for exposing the upper surfaces of the lower interconnects 101 in the porous low-dielectric-constant film 102, while forming interconnect trenches 105 connecting to the respective via holes 104 also in the porous low-dielectric-constant film 102. As a dry etching gas used for dry etching performed with respect to the porous low-dielectric-constant film 102, a gas composed of, e.g., $CHF_3$, $CF_2H_2$, $C_5F_8$, or the like, which is a typical reactive gas, is used.

As the dry etching of the porous low-dielectric-constant film 102 proceeds, deposited films 106 each made of a reaction product (containing C and F elements) between the Si—O—C skeleton contained in MSQ composing the porous low-dielectric-constant film 102 and the dry etching gas are formed over the sidewalls of the via holes 104 and the bottom portions and sidewalls of the interconnect trenches 105, as shown in FIG. 1A.

Figure 1B:
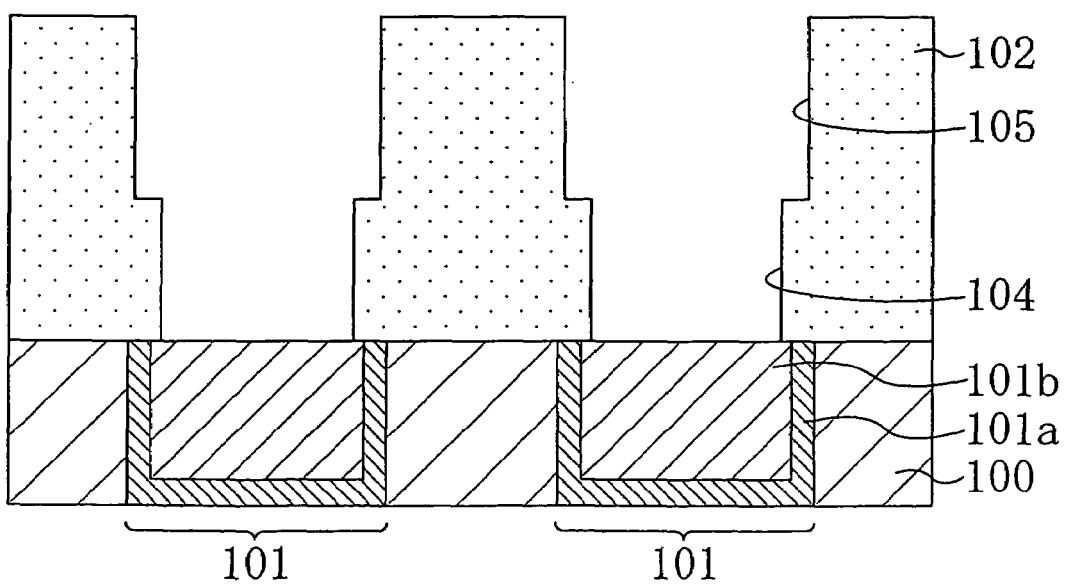

Next, as shown in FIG. 1B, the photoresist 103 is removed by ashing after the dry etching of the porous low-dielectric-constant film 102. Subsequently, the wafer after ashing is washed. At this time, during the ashing step or the washing step, the deposited film 106 is also removed. As a result, voids (not shown) having diameters of about 1 nm to about 2 nm are exposed at the regions of the porous low-dielectric-constant film 102 from which the deposited films 106 have been removed, i.e., at the sidewalls of the via holes 104 and at the bottom portions and sidewalls of the interconnect trenches 105.

Figure 2A:
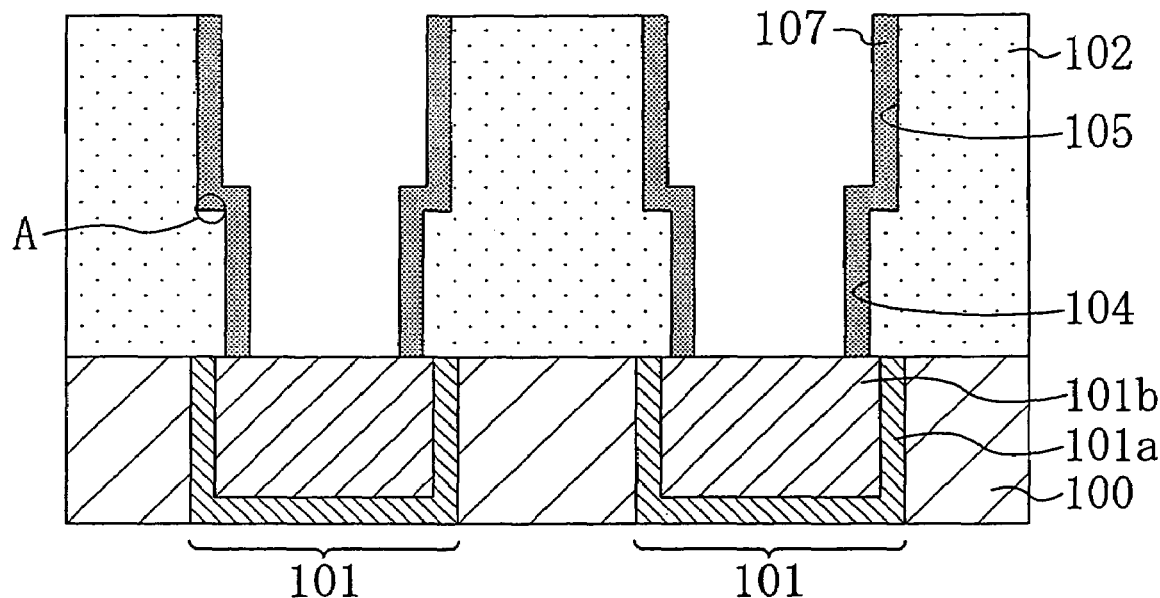
FIGS. 2A and 2B are cross-sectional views illustrating the principal process steps of the method for fabricating the semiconductor device according to the embodiment.

Next, as shown in FIG. 2A, a solution prepared by mixing fine particles each made of a fullerene (C60) or silica ($SiO_2$) and having a diameter of about 1 nm to about 2 nm in an organic solvent such as, e.g., isopropyl alcohol is applied onto the sidewalls of the via holes 104 and onto the bottom portions and sidewalls of the interconnect trenches 105. As a method for applying the solution, there can be listed one which uniformly applies the solution by spin coating using, e.g., a spin coater used in a resist coating step or the like. In accordance with the method, the solution is applied dropwise to the sidewalls of the via holes 104 and to the bottom portions and sidewalls of the interconnect trenches 105, while a wafer is horizontally held.

Then, thermal drying at a temperature of, e.g., 50° C. to 200° C. is performed for 30 seconds with respect to the solution containing the fine particles mixed therein, thereby removing the solvent therefrom (e.g., isopropyl alcohol or the like). This allows fine particle films 107 each having a thickness of about 1 nm to about 5 nm and composed of the plurality of aggregately deposited fine particles each having a diameter or about 1 nm to about 2 nm to be formed over the sidewalls of the via holes 104 and the bottom portions and sidewalls of the interconnect trenches 105 in such a manner as to fill in the voids exposed at the surfaces of the porous low-dielectric-constant film 102.

A detailed description will be given herein below to the fine particle films 107 with reference to FIG. 3.

FIG. 3 is an enlarged view of the near-surface portion of the porous low-dielectric-constant film 102 formed with the fine particle film 107. Specifically, FIG. 3 is an enlarged view of the portion A shown in FIG. 2A.

As shown in FIG. 3, fine particles 200 composing the fine particle film 107 formed on the surface of the porous low-dielectric-constant film 102 include fine particles 200a which enter the insides of voids 201. Even when the fine particles 200 are thus diffused into the porous low-dielectric-constant film 102 via the voids 201 or connecting portions 202 connecting the voids 201 to each other, the fine particles 200a that have entered the insides of the voids 201 are located at positions at depths of about 1 nm to about 2 nm from the surface of the porous low-dielectric-constant film 102 and stay in the surface region of the porous low-dielectric-constant film 102 because the diameters W of the voids 201 are not more than about 1 nm and the diameters of the fine particles 200 are about 1 nm to about 2 nm.

Thus, in accordance with the method for fabricating a semiconductor device according to the embodiment, the surfaces of the portions of the porous low-dielectric-constant film 102 which are formed with the via holes 104 and with the interconnect trenches 105 can be coated with the fine particles 200 equal in size to the voids 201 exposed at the surfaces of the portions thereof during the formation of the fine-particle films 107. This allows the fine particles 200 composing the fine particle film 107 to fill in the voids 201 exposed at the surfaces of the portions of the porous low-dielectric-constant film 102 during the formation of the via holes 104 and the interconnect trenches 105, as shown in FIG. 3.

In addition, as shown in FIG. 3, the fine particles 200a that have entered the voids 201 stay in the surface region of the porous low-dielectric-constant film 102 and there is no entrance of the fine particles 200a into the internal region of the porous low-dielectric-constant film 102. Accordingly, the voids 201 present in the porous low-dielectric-constant film 102 are kept from being completely filled with the fine particles 200. This allows the porous low-dielectric-constant film 102 to retain a sufficiently lower dielectric constant.

Figure 2B:
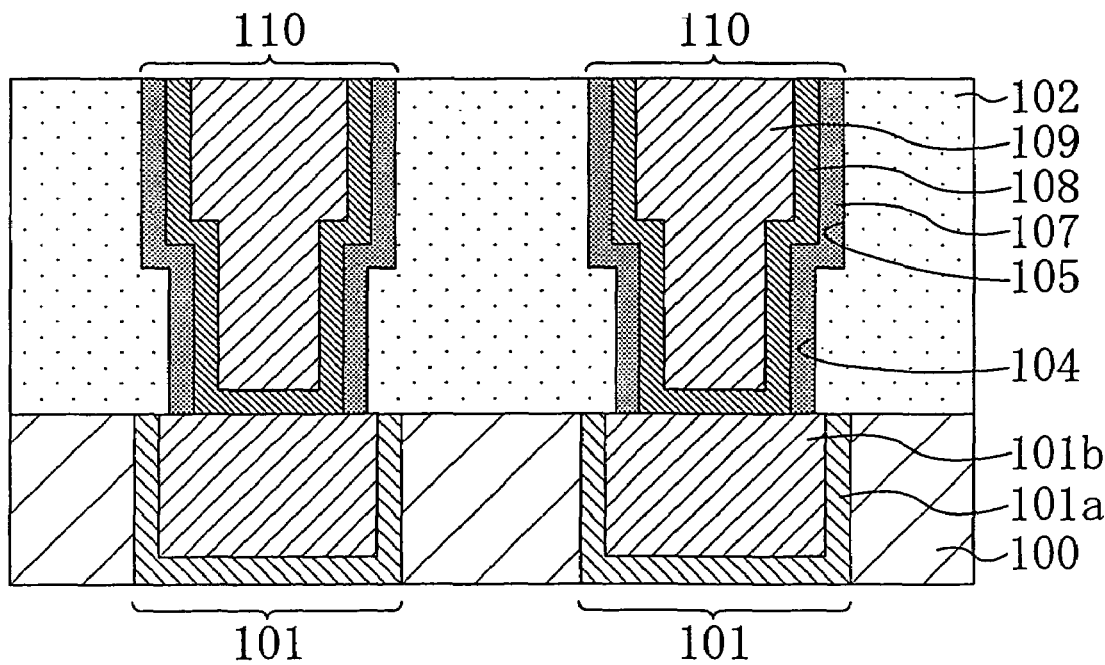
Figure 4A:
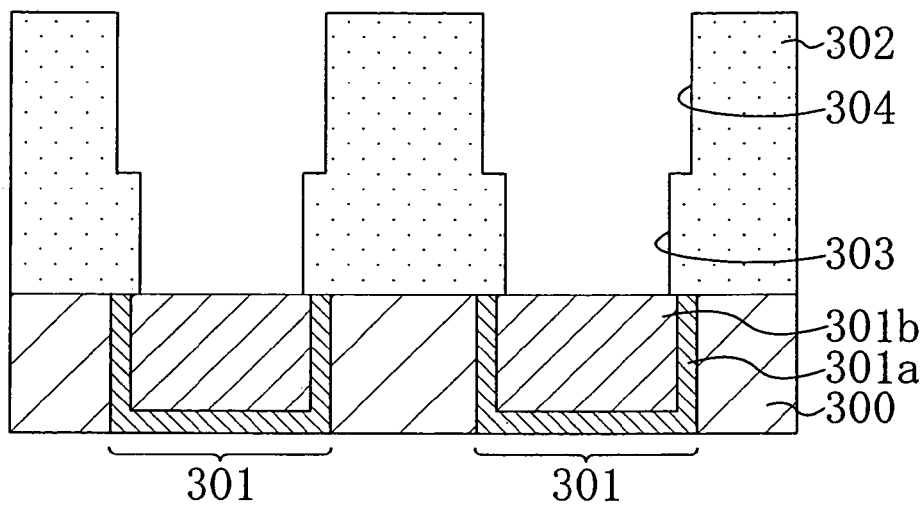
FIGS. 4A to 4C are cross-sectional views illustrating the principal process steps of a method for fabricating a semiconductor device according to a conventional embodiment.
Figure 4B:
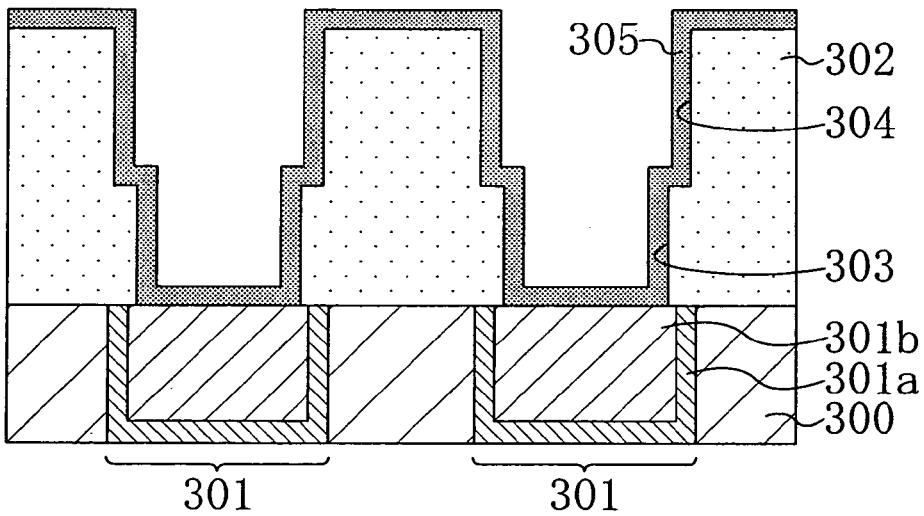
Figure 4C:
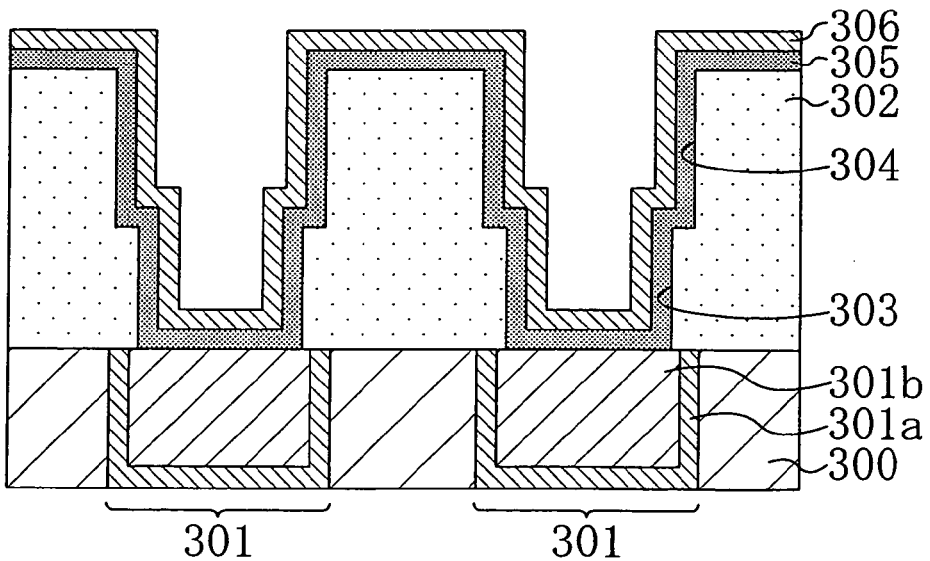
Figure 5A:
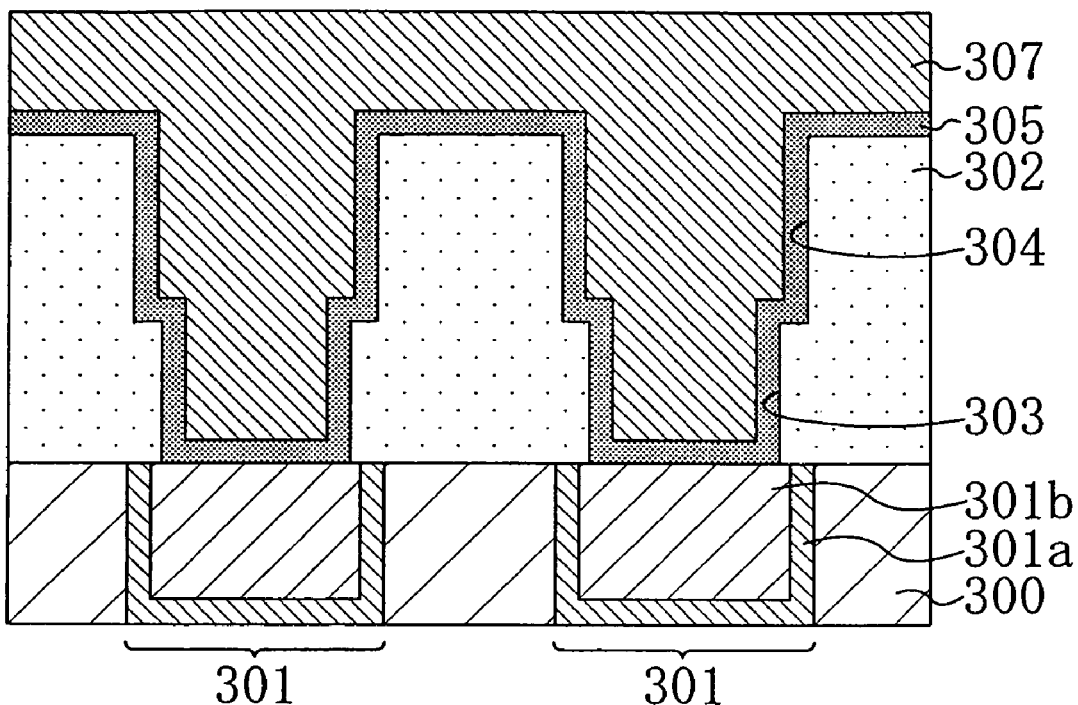
FIGS. 5A and 5B are cross-sectional views illustrating the principal process steps of the method for fabricating the semiconductor device according to the conventional embodiment.
Figure 5B:
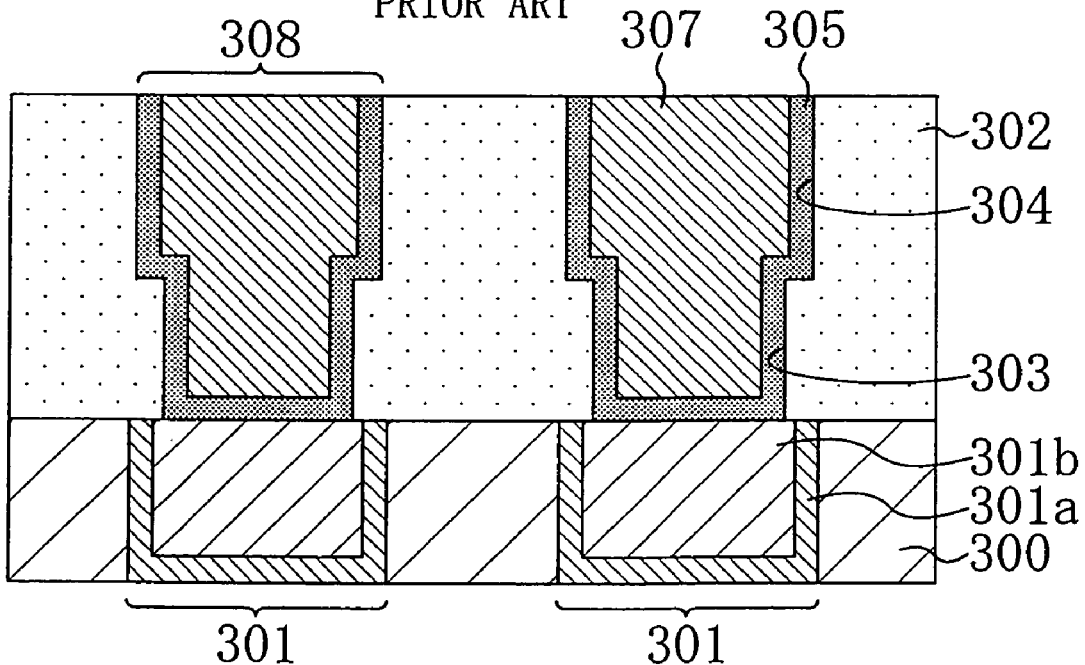

Next, as shown in FIG. 2B, a barrier metal 108 made of, e.g., TaN, TiN, WN, or the like is formed over the bottom portions and sidewalls of the via holes 104, the bottom portions and sidewalls of the interconnect trenches 105, and the upper surface of the porous low-dielectric-constant film 102. Subsequently, a Cu film as a seed layer used for electrolytic plating is formed on the barrier metal 108 and Cu is buried in the via holes 104 and in the interconnect trenches 105 by electrolytic plating so that a buried layer 109 made of Cu is formed. Then, the respective portions of the barrier metal 108 and the buried layer 109 which are located outside the interconnect trenches 105 are removed by CMP till the surface of the porous low-dielectric-constant film 102 is exposed, whereby surface planarization is performed.

In this manner, an interconnect plug made of buried Cu is formed in each of the via holes 104 with the fine particle film 107 and the barrier metal 108 interposed therebetween, while an upper interconnect 110 made of buried Cu is formed in each of the interconnect trenches 105 with the fine particle film 107 and the barrier metal 108 interposed therebetween.

Thus, in accordance with the method for fabricating the semiconductor device according to the embodiment, the fine particle films 107 composed of the plurality of aggregately deposited fine particles 200 are formed over the sidewalls of the via holes 104 and the bottom portions and sidewalls of the interconnect trenches 105, as shown in FIG. 2A. This allows the fine particles 200 composing the fine particle films 107 to fill in the voids 201 exposed at the portions of the porous low-dielectric-constant film 102 which are formed with the via holes 104 and the interconnect trenches 105, as shown in FIG. 3.

As a result, as shown in FIG. 2B, the barrier metal 108 is not formed directly on the porous low-dielectric-constant film 102 having the surfaces at which the voids 201 are exposed but can be formed over the porous low-dielectric-constant film 102 with the fine particle films 107 interposed therebetween. This can prevent the material composing the barrier metal 108 from being diffused into the porous low-dielectric-constant film 102 via the voids 201 and allow the barrier metal 108 to retain a sufficient barrier property.

In addition, as shown in FIG. 2B, the buried layer 109 can be formed in each of the via holes 104 and the interconnect trenches 105 with the fine particle film 107 and the barrier metal 108 interposed between itself and the porous low-dielectric-constant film 102. This can reliably prevent the material Cu composing the buried layer 109 from being diffused into the porous low-dielectric-constant film 102.

Thus, in the semiconductor device fabricated in accordance with the fabrication method according to the embodiment of the present invention, the fine particle films 107 are formed over the sidewalls of the via holes 104 and the bottom portions and sidewalls of the interconnect trenches 105, i.e., over the surfaces of the portions of the porous low-dielectric-constant film 102 which are formed with the via holes 104 and the interconnect trenches 105 in such a manner as to fill in the voids exposed at the surfaces of the portions thereof.

Figure 6A:
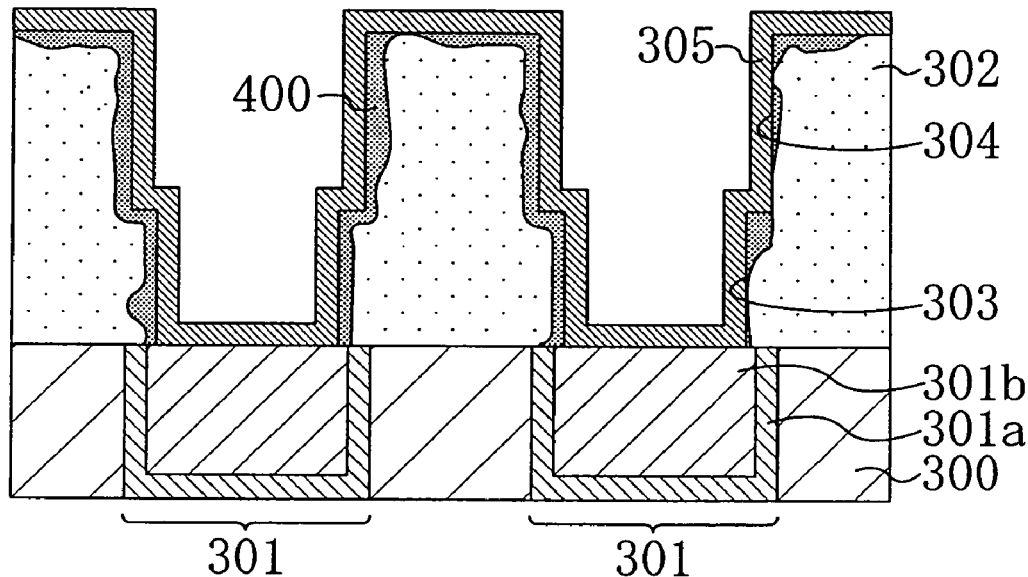
FIGS. 6A and 6B are cross-sectional views illustrating the principal process steps of the method for fabricating the semiconductor device according to the conventional embodiment.
Figure 6B:
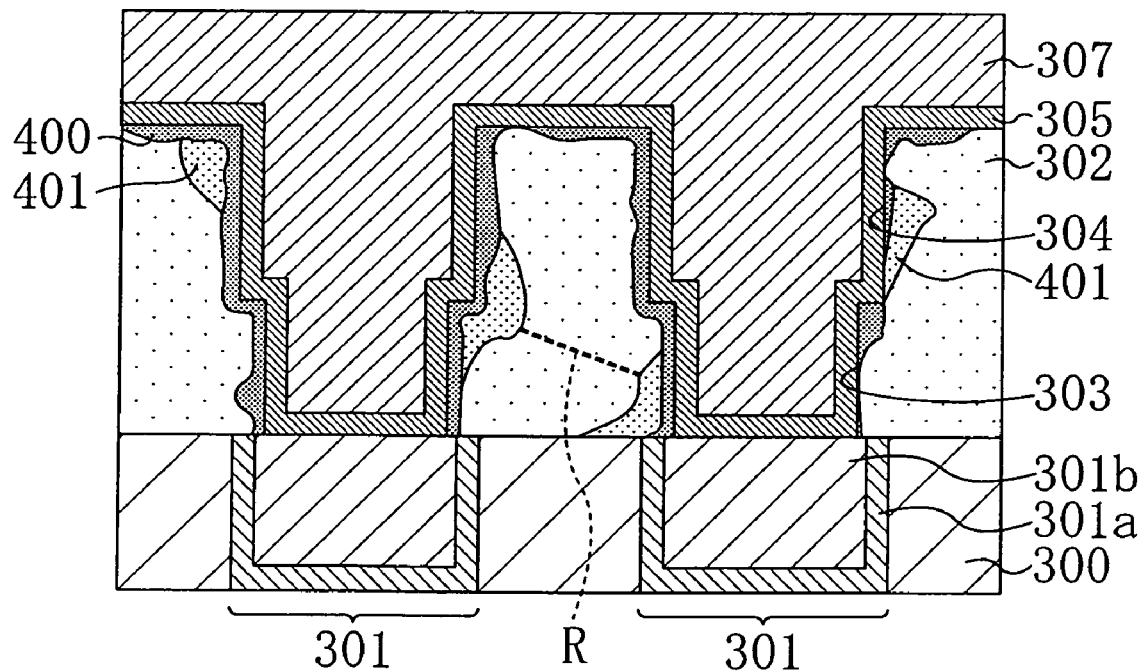

This makes it possible to prevent the material Cu composing the buried layers 109 from passing through the barrier metal 108 and being diffused into the porous low-dielectric-constant film 102 via the voids during the fabrication and operation of the semiconductor device so that the Cu diffusion regions (see 401 in FIG. 6B mentioned above) are not formed.

Therefore, in the semiconductor device according to the present invention, a leakage current does not flow between the individual upper interconnects 110. As a result, it is possible to implement Cu-Low K interconnects each having high reliability and a miniaturized structure and improve each of the reliability and production yield of the semiconductor device.

Although the semiconductor device according to the embodiment of the present invention and the fabrication method therefor have been described by using the upper interconnects 110 each made of Cu as a specific example, the present invention is not limited thereto. The same effects as achieved by the semiconductor device according to the embodiment and the fabrication method therefor can also be achieved even when interconnects made of, e.g., W, Al, Au, or the like are used.

Although the semiconductor device according to the embodiment and the fabrication method therefor have used the solution prepared by mixing the fine particles in the solvent (e.g., isopropylene alcohol or the like) during the formation of the fine particle films 107 as shown in FIG. 2A, the present invention is not limited thereto. It is also possible to use a solution prepared by, e.g., mixing fine particles and a hydrocarbon-based alcohol surface active agent in a solvent.

The arrangement allows the surface active agent to function as a dispersant and thereby allows the dispersion of the fine particles mixed in the solvent. As a result, it is possible to form the fine particle films 107 composed of the plurality of evenly and aggregately deposited fine particles over the sidewalls of the via holes 104 and the bottom portions and sidewalls of the interconnect trenches 105.

Thus, the present invention allows interconnects each having high reliability and a miniaturized structure to be implemented so that it is useful for a semiconductor device having highly-integrated and miniaturized LSI interconnects and a fabrication method therefor.

What is claimed is:

1. A semiconductor device comprising:
a porous low-dielectric-constant film formed on a substrate and having an opening; and
a fine particle film composed of a plurality of aggregately deposited fine particles formed on a surface of the portion of the porous low-dielectric-constant film which is formed with the opening, wherein:
the fine particles are filled in voids exposed at the surface of the portion of the porous low-dielectric-constant film which is formed with the opening, and
a size of each of the fine particles is equal to a size of each of the voids.

2. The semiconductor device of claim 1, wherein a conductive material forming a via or an interconnect is buried in the opening such that the fine particle film is interposed between the conductive material and the porous low-dielectric-constant film.

3. The semiconductor device of claim 2, wherein a barrier film is interposed between at least the conductive material and the fine particle film.

4. The semiconductor device of claim 3, wherein the barrier film is made of a material selected from TaN, TiN and WN.

5. The semiconductor device of claim 2, wherein the conductive material is selected from Cu, W, Al and Au.

6. The semiconductor device of claim 1, wherein the porous low-dielectric-constant film contains a methyl-containing-polysiloxane-based material.

7. The semiconductor device of claim 1, wherein each of the fine particles is made of a fullerene or silicon dioxide.

* * * * *